United States Patent [19]
Lei et al.

[11] Patent Number: 6,083,321
[45] Date of Patent: Jul. 4, 2000

[54] FLUID DELIVERY SYSTEM AND METHOD

[75] Inventors: Lawrence Lei, Milpitas; Son Trihn, Cupertino; Joel M. Huston, Sunnyvale, all of Calif.

[73] Assignee: Applied Materials, Inc., Santa Clara, Calif.

[21] Appl. No.: 08/893,462

[22] Filed: Jul. 11, 1997

[51] Int. Cl.[7] .................................................. C23C 16/00
[52] U.S. Cl. ......................... 118/719; 118/715; 156/345; 204/298.07; 204/298.25
[58] Field of Search .................................. 118/715, 719; 204/298.07, 298.25; 156/345

[56] References Cited

U.S. PATENT DOCUMENTS

| | | | |
|---|---|---|---|
| 4,722,298 | 2/1988 | Rubin et al. .............................. | 118/715 |
| 4,852,516 | 8/1989 | Rubin et al. .............................. | 118/715 |
| 4,945,856 | 8/1990 | Stewart .................................... | 118/715 |
| 5,076,205 | 12/1991 | Vowles et al. ........................... | 118/719 |
| 5,425,803 | 6/1995 | van Schravendijk ....................... | 95/46 |
| 5,451,258 | 9/1995 | Hillman et al. .......................... | 118/715 |
| 5,516,367 | 5/1996 | Lei et al. ................................. | 118/725 |
| 5,575,854 | 11/1996 | Jinnouchi et al. ....................... | 118/715 |
| 5,641,358 | 6/1997 | Stewart .................................... | 118/715 |
| 5,732,744 | 3/1998 | Barr et al. ............................... | 138/106 |
| 5,758,680 | 6/1998 | Kaveh et al. ............................ | 137/14 |
| 5,860,640 | 1/1999 | Marohl et al. ...................... | 269/289 R |
| 5,882,419 | 3/1999 | Sinha et al. ............................. | 118/729 |

OTHER PUBLICATIONS

Europe International Search Report Dated Nov. 2, 1998.

*Primary Examiner*—Jeffrie R Lund
*Attorney, Agent, or Firm*—Thomason, Moser and Patterson

[57] ABSTRACT

The present invention generally provides a gas delivery system adapted for positioning near the process chamber. More particularly, the present invention provides an apparatus for processing a substrate that includes a process chamber and a gas delivery system. The gas delivery system is in fluid communication with and is adapted to supply one or more process gases and/or carrier/purge gases to the process chamber. The gas delivery system is positioned proximal the process chamber within about two to three feet of the process chamber.

16 Claims, 3 Drawing Sheets

FLUID DELIVERY SYSTEM AND METHOD

BACKGROUND OF THE INVENTION

1. Field of the Invention

The present invention relates to the field of semiconductor substrate processing equipment. More particularly, the present invention relates to a fluid delivery system that is mounted in close proximity to the chamber and that facilitates the creation of a modular process system design.

2. Background of the Related Art

In the fabrication of integrated circuits, equipment has been developed to automate substrate processing by performing several sequences of processing steps without removing the substrate from a vacuum environment, thereby reducing transfer times and contamination of substrates. Such a system has been disclosed for example by Maydan et al., U.S. Pat. No. 4,951,601, in which a plurality of processing chambers are connected to a transfer chamber. A robot in a central transfer chamber passes substrates through slit valves in the various connected processing chambers and retrieves them after processing in the chambers is complete.

The processing steps carried out in the vacuum chambers typically require the deposition or etching of multiple metal, dielectric and semiconductor film layers on the surface of a substrate. Examples of such processes include chemical vapor deposition (CVD), physical vapor deposition (PVD), and etching processes. Although the present application primarily discusses CVD process chambers and systems, the present invention is equally applicable to other process chambers and systems that utilize a fluid for gas delivery or gas generation.

Process chambers are employed to deposit thin films on semiconductor substrates. The process of depositing the thin films uses a variety of gases provided to the chamber for carrying out the processes. For example, the chambers typically utilize a purge gas such as argon directed to the backside of the edge of the substrate to provide a shield of purge gas that prevents deposition on the edge and backside surfaces of the substrate. In addition, the material to be deposited on the substrate is typically introduced into the chamber suspended in a carrier gas, such as helium. Often the materials used to deposit the films on the substrate are in their liquid phases at room temperature (e.g., DMAH, TEOS, and TDMAT). Thus, to introduce these materials into the process chamber, the material is typically charged in an evaporator so that it becomes mixed with and carried by the carrier gas. One example of an evaporator is a bubbler. In a bubbler, a carrier gas is introduced through a nozzle immersed in the liquid material generating bubbles of the carrier gas that ascend through the liquid. As a result, the liquid material is vaporized into and becomes mixed with the carrier gas and the mixture is introduced into the process chamber for deposition of the material onto the substrate. Other gases are also commonly used in the processing of substrates for example to act as a system purge (e.g., nitrogen) or as a reactant (e.g., hydrogen and oxygen).

As shown in the prior art drawing of FIG. 1, the gas delivery system used to control and deliver the gas to the various process chambers is generally positioned at the back of the system. Therefore, plumbing must be installed to connect each of the process chambers to the gas delivery system. The plumbing typically extends from the gas delivery system beneath the platform to the individual process chambers. Installation and maintenance of the system as well as replacement of any of the system components, therefore, requires substantial manpower due to the substantial plumbing.

In addition, positioning the gas delivery system at the back of the process system necessarily places the controls for the gas delivery a substantial distance from the process chamber, typically an average of about ten feet. Therefore, gas delivery to the chamber (e.g. the time for the gas to reach the chamber from the gas delivery system) may be sensitive to the position of the chamber relative to the gas delivery system which may affect the repeatability of the process and may result in condensation within the system. Further, placing the gas delivery system at the back of the system wastes space and reduces the mobility of the system components hampering interchangeability and flexibility making modular systems less feasible.

Therefore, there is a need to increase the repeatability of the system and to provide a gas delivery system that facilitates interchangeability and a modular design.

SUMMARY OF THE INVENTION

The present invention generally provides a gas delivery system adapted for positioning near the process chamber. More particularly, the present invention provides an apparatus for processing a substrate that includes a process chamber and a gas delivery system. The gas delivery system is in fluid communication with and is adapted to supply one or more process gases to the process chamber. The gas delivery system is positioned proximal the process chamber and is preferably attached thereto. Preferably, the gas delivery system is no more than about two to three feet from the process chamber so that the gas only has to travel about two to three feet therebetween.

One aspect of the invention provides a process chamber module comprising a module support frame supporting the process chamber and the gas delivery system. The module support frame has a set of wheels attached thereto to enhance the mobility of the process chamber module. Another aspect of the invention provides a method for delivering a gas to a process chamber comprising the steps of positioning the gas delivery system near the process chamber and providing fluid communication therebetween.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

The present invention generally provides a gas delivery system 10 that is positioned proximal and is attached to the process chamber 30. For clarity and ease of description, the following description refers primarily to a CVD process chamber and system although the present invention is equally applicable to other types of processes that utilize fluid delivery systems. In addition, although the description often uses the term "gas," it is to be understood that the present invention is applicable to all types of fluids.

Figure 1:
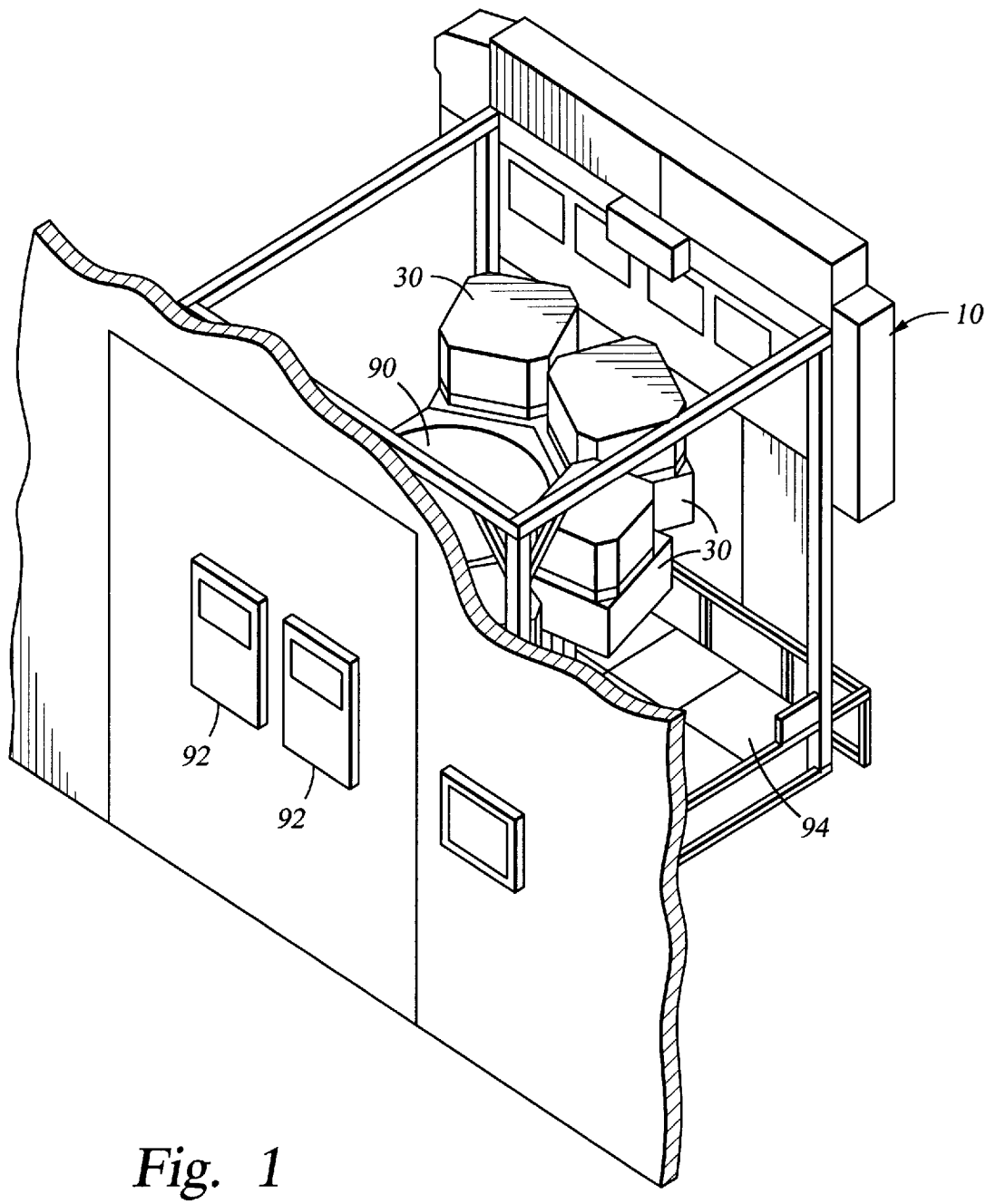
FIG. 1 is a partial perspective view of a prior art process system having the gas delivery system positioned at the back of the system.

As shown in FIG. 1, substrate processing systems typically comprise a combination of loadlocks 92 through which the substrates are introduced into the system, a transfer chamber 90 which houses a robot that moves the substrates within the system, and a plurality of process chambers 30 each adapted to perform a specific process step on the substrates. Typically, the processes performed in the process chambers 30 involve the deposition of a thin film of material on the surface of the substrate. As previously discussed, the films are deposited by introducing the material to be deposited on the substrate into the process chamber 30 in the form of a gas so that more uniform films may be created.

Often, the material to be deposited is in the form of a liquid at room temperature. Therefore, the material is vaporized into a carrier gas in an evaporator 22 (shown in FIG. 3), such as a bubbler. The carrier gas supporting the material is then passed into the process chamber 30 for deposition of the material onto the substrate. Thus, the process system must also include a gas delivery system 10 that includes the evaporator 22 and also includes the other fluid delivery components necessary to direct and control the flow of the carrier gas containing the material to the process chamber 30.

In addition, the process chamber 30 requires other gases to complete the process. For example, a purge gas, such as argon, is typically directed at the backside of the edge of the substrate to prevent the deposition of the material on the beveled edges and the relatively rough backside of the substrate. In this way, the purge gas helps to reduce the risk of particle generation in the system. Also, some gases, such as nitrogen, are used to purge the system at start-up or following processing. Likewise, other gases, such as oxygen and helium, are used as reactants to facilitate deposition of the material on the substrate. Consequently, the gas delivery system 10 must provide for the supply and control of all of the gases necessary for the process in each process chamber 30.

As previously mentioned, prior art systems have positioned the gas delivery system 10 at the back of the system and then provided plumbing, or fluid communication lines, between the gas delivery system 10 and the process chambers 30 resulting in a gas delivery that is dependant upon the position of the process chamber 30 in the system. Commonly, the gas delivery system 10 is an average of about ten feet from the process chambers 30. Thus, gas delivery variables, such as time for the gas to reach the process chamber 30, the concentration of the gas initially entering the process chamber 30, and gas shut-off, are largely dependent on the location of the process chamber 30 within the system in these prior art designs. This remote positioning may cause condensation to form in the communication lines and may affect the repeatability of the system.

Thus, in an effort to overcome these problems and provide greater repeatability, the present invention locates the gas delivery system 10 associated with a given process chamber 30 near the process chamber 30, preferably attached thereto and/or on a common module support frame 50. Preferably, the gas delivery system 10 is positioned sufficiently close to the process chamber 30 that the communication lines used to deliver the gas to the process chamber 30 are only about two to three feet long at most. Therefore, as used herein, the terms "near," "close proximity," and "proximal" when referring to the relative position of the gas delivery system 10 to the process chamber 30, mean that these components are no greater than about five feet apart. Positioning the gas delivery system 10 near the process chamber 30 increases repeatability because the system is not sensitive to the position of the process chamber 30. Also, due to the reduced distance that the gas must travel, the system experiences less condensation and better conductance.

Figure 2:
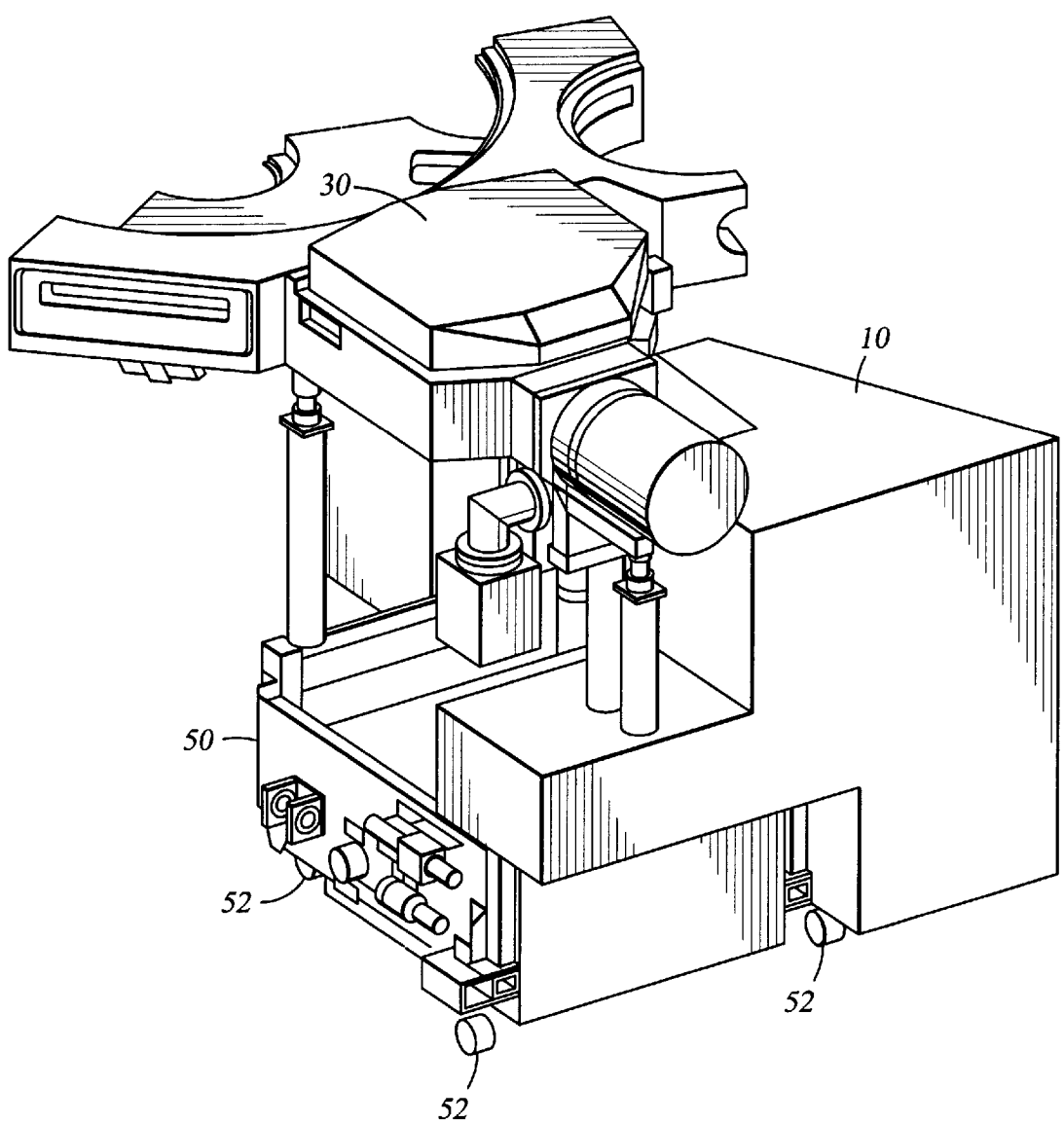
FIG. 2 is a perspective view of the process chamber and the gas delivery system mounted in close proximity on a module support frame having wheels.

FIG. 2 shows the process chamber 30 and the gas delivery system 10 mounted on a common module support frame 50. As shown in the figure, the module support frame 50 is a frame assembly that is constructed of a substantially rigid material that is capable of easily supporting the weight of the process chamber 30 and the gas delivery system 10. Although the module support frame 50 may be fixedly mounted to (or a portion of) the platform 94 (see FIG. 1), the module support frame 50 is preferably a separate member that includes a set of wheels 52 mounted to lower end to provide mobility for the module support frame 50. Preferably, the module support frame 50 includes at least four wheels 54 for stability. Note that the module support frame 50 is preferred because it adds an element of mobility and modularity to the system. However, the primary focus of the present invention is the repositioning of the gas delivery system 10 nearer the process chamber 30 than in previous designs. Therefore, although the following description refers primarily to the individual components attached to the module support frame 50, the module support frame 50 may be eliminated and the process chamber 30 and the gas delivery system 10 mounted to any available surface as long as they are mounted in close proximity.

Accordingly, in a preferred embodiment, the process chamber 30 is attached to the module support frame 50. Likewise, the gas delivery system 10 containing the gas delivery components associated with the process chamber 30 is also attached to the module support frame 50. The gas delivery system 10 and the process chamber 30 are interconnected by fluid communication lines. The process chamber 30 may be any chamber in which substrates are processed and that utilizes a fluid in the process. Examples of such process chambers 30 include CVD process chambers and PVD process chambers.

Figure 3:
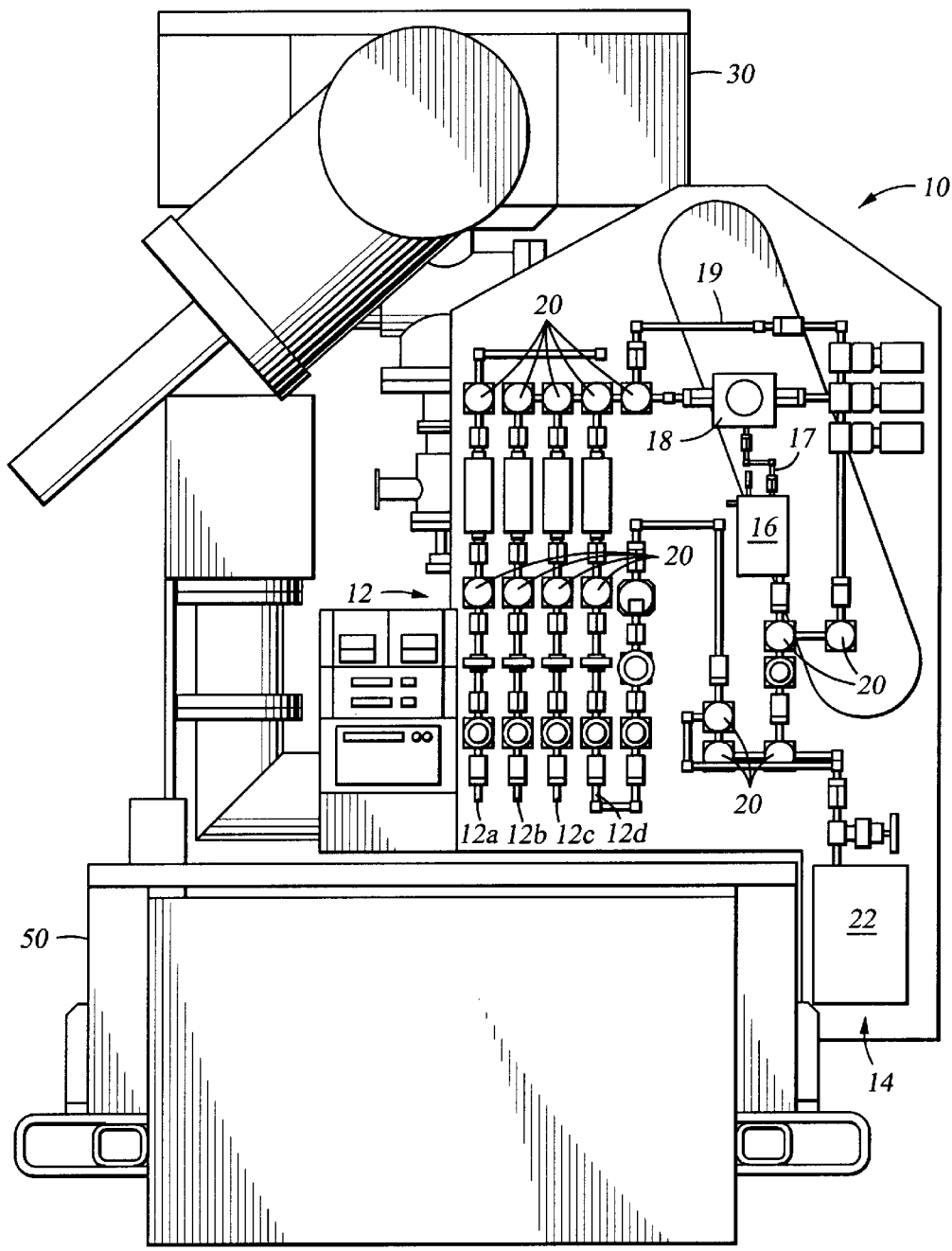
FIG. 3 is an elevational view of the system shown in FIG. 2 showing the individual components of one particular gas delivery system.

The gas delivery system 10 generally comprises all of the gas delivery components necessary for the process to be carried out in the associated process chamber 30. FIG. 3 shows a CVD type process chamber 30 mounted on a module support frame 50 interconnected to a gas delivery system 10 that is also mounted to the module support frame 50. The gas delivery system 10 is opened showing the gas delivery components associated with this particular process chamber 30. Note that the present invention is not limited to this particular gas delivery system 10, but may be applied to any form of gas delivery system 10. In the example shown in FIG. 3, the gas delivery system 10 includes components that are typical to such processes including valves 20, a liquid flow meter 16, communication lines 17, an injection control valve 18, bypass lines 19, and an evaporator 22 including a liquid supply 14. Other typical components include measurement devices (e.g., thermocouples), monitor displays, degassers, gas supplies, pumps, and temperature control systems (e.g., heaters) among others.

The example shown in FIG. 3 includes four gas supply lines 12. One gas supply line 12a supplies argon to the process chamber to act as a bottom purge that prevents deposition on the backside and edges of the substrate. The other three gas supply lines 12 provide hydrogen 12b, nitrogen, 12c, and helium 12d, to the process chamber 30. The hydrogen and helium are typically introduced into the system with the carrier gas containing the vaporized material where they are combined. The helium also acts as the carrier gas for the system. As shown in the figure, the communication lines direct the helium to the evaporator 22, or bubbler, where the material is vaporized into the carrier gas. The carrier gas containing the material (e.g., TEOS or TDMAT) passes through a flow meter 16 and then through an injection control valve 18 before being passed to the process chamber 30 along with the helium and hydrogen. The nitrogen acts primarily as a purge gas to purge the system following maintenance or start-up. Once the gases exit the gas delivery system 10 they need only flow about two to three feet at most because, in the present invention, the gas delivery system 10 is positioned near and is preferably attached to the process chamber.

In addition to increasing the repeatability of the system and reducing the condensation formed in the system, the present invention, by positioning the gas delivery system 10 near the process chamber 30, also facilitates a modular system wherein the individual process chambers 30 may be moved and replaced without redesigning the full system. In the prior systems, as in the one shown in FIG. 1, the process chambers 30 are fixed within the system to the platform 94. Therefore, if one of the process chambers 30 fails, the system is shut down until the damaged process chamber 30 is repaired or replaced. However, replacement of a fixed process chamber 30 requires that the process chamber 30 be physically detached and removed from the platform 94 and the system. Thus, the system may be shut down for extended periods during maintenance of the system. In addition, modifications to the system require that the system be remanufactured to accommodate the attachment of a new or different process chamber to the system and the gas supply lines. To overcome these drawbacks of the prior systems, the industry has moved toward a more modular design wherein the individual process chambers 30 are interchangeable. In this way, when a process chamber 30 fails, it can be quickly removed and a new process chamber 30 can simply be rolled into the damaged chamber's place while the damaged chamber is repaired. Likewise, process systems using modular designs are more easily designed and updated because of the interchangeability.

The present invention facilitates this interchangeability by linking the gas delivery system 10 associated with the individual process chamber 30 to the process chamber 30 and positioning the gas delivery system 10 and the process chamber 30 near one another on a moveable cart, the module support frame 50. Attaching the components together eliminates the need to plumb the process chamber 30 to a remote gas delivery system 10. Additionally, when the system is altered, the gas delivery system 10 of the system does not have to be redesigned because the gas delivery system 10 is attached to the relevant process chamber 30. Further, maintenance problems associated with the process chamber 30 or the gas delivery system 10 may also be handled more easily because a replacement module can simply be quickly inserted into the system while the module is repaired. Further, positioning the gas delivery system 10 near the process chamber 30 reduces the time, labor, and cost associated with manufacturing and assembly of the process chamber 30 and the module because the interconnecting communication lines are shorter and may be installed at the factory where the components are readily accessible rather than in the remote location of the clean room.

While the foregoing is directed to the preferred embodiment of the present invention, other and further embodiments of the invention may be devised without departing from the basic scope thereof, and the scope thereof is determined by the claims which follow.

What is claimed is:

1. An apparatus for processing a substrate using one or more gases, comprising:

a modular support frame;

a process chamber mounted on and supported by the modular support frame; and a gas delivery system mounted on and supported by the modular support frame in fluid communication with and adapted to supply the one or more gases to the process chamber, the gas delivery system comprising: one or more liquid precursors.

2. The apparatus of claim 1, wherein the gas delivery system is attached to the process chamber.

3. The apparatus of claim 1, further comprising wheels attached to a lower end of the module support frame.

4. The apparatus of claim 1, wherein the process chamber is a chemical vapor deposition process chamber.

5. The apparatus of claim 1, wherein the gas delivery system further comprises:

a set of gas supply lines in flow communication with the process chamber, and a plurality of valves in flow communication with the set of gas supply lines and the process chamber adapted to control the flow therebetween.

6. The apparatus of claim 1, wherein the gas delivery system further comprises an evaporator.

7. The apparatus of claim 1, wherein the distance between the gas delivery system and the process chamber is less than about three feet.

8. A process chamber module, comprising:

a module support frame;

a process chamber mounted on and supported by the module support frame; and a gas delivery system mounted on and supported by the module support frame and adapted to supply one or more gases to the process chamber, the gas delivery system comprising:
        one or more liquid precursors and one or more evaporators.

9. The apparatus of claim 8, wherein the gas delivery system is positioned proximal the process chamber.

10. The apparatus of claim 8, wherein the gas delivery system is attached to the process chamber.

11. The apparatus of claim 8, further comprising wheels attached to a lower end of the module support frame.

12. The apparatus of claim 8, wherein the process chamber is a chemical vapor deposition process chamber.

13. The apparatus of claim 8, wherein the distance between the gas delivery system and the process chamber is less than about three feet.

14. A method for delivering one or more gases to a process chamber, comprising:

mounting a gas delivery system, adapted to supply the one or more gases, and a process chamber on a modular support frame wherein the modular support frame supports the gas delivery system and the process chamber;

providing fluid communication between the gas delivery system and the process chamber; and delivering one or more gases from the gas delivery system, including one or more gases from one or more liquid precursors disposed in the gas delivery system.

15. The method of claim 14, wherein the module support frame comprises wheels.

16. The method of claim 14, wherein the gas delivery system comprises an evaporator.

* * * * *